United States Patent
Magcale

(10) Patent No.: US 11,683,915 B1
(45) Date of Patent: *Jun. 20, 2023

(54) DATA CENTER LIQUID CONDUCTION AND CARBON DIOXIDE BASED COOLING APPARATUS AND METHOD

(71) Applicant: Nautilus TRUE, LLC, Pleasanton, CA (US)

(72) Inventor: Arnold Castillo Magcale, San Ramon, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/460,672

(22) Filed: Aug. 30, 2021

Related U.S. Application Data

(63) Continuation of application No. 17/221,797, filed on Apr. 3, 2021.

(51) Int. Cl.
*H05K 7/20* (2006.01)

(52) U.S. Cl.
CPC ..... *H05K 7/20818* (2013.01); *H05K 7/20309* (2013.01); *H05K 7/20327* (2013.01)

(58) Field of Classification Search
CPC ............ F25B 9/008; F25B 40/00; F25B 2600/2501; F25B 2600/2513; F25B 40/02; F25B 39/00; F25B 9/04; F28D 9/0093; F28D 2021/0084; F28D 2021/0085; G06F 1/20
USPC ..... 361/679.53, 698, 699, 688; 62/498, 115; 165/104.19, 104.21, 104.33, 104.32, 80.4
See application file for complete search history.

(56) References Cited

U.S. PATENT DOCUMENTS

| 6,668,572 | B1 | 12/2003 | Seo et al. | |
|---|---|---|---|---|
| 10,655,894 | B2 * | 5/2020 | Lee | F25B 7/00 |
| 2009/0120618 | A1 | 5/2009 | Konig | |
| 2009/0232665 | A1 | 9/2009 | Gocho et al. | |

(Continued)

FOREIGN PATENT DOCUMENTS

| WO | WO-0050822 A1 | 8/2000 |
|---|---|---|
| WO | WO-2020230879 A1 | 11/2020 |

OTHER PUBLICATIONS

U.S. Appl. No. 17/221,797 Office Action dated Apr. 26, 2023.

*Primary Examiner* — Mandeep S Buttar
(74) *Attorney, Agent, or Firm* — Wilson Sonsini Goodrich & Rosati

(57) ABSTRACT

Embodiments disclosed include a heat exchange apparatus and method comprising, in an electronic device, a first heat exchanger for exchanging heat with the device wherein the heat exchanger comprises a flow duct for receiving a fluid, and at least a portion of the flow duct is arranged for thermal communication with the device. Preferred embodiments include a pressure reducing unit comprising a pump associated with the flow duct and a Venturi tube configured for reducing the pressure of the fluid in the portion of the flow duct arranged in thermal communication with the device and less than the pressure external to the duct. An embodiment includes a fluid reservoir, and a second heat exchanger for removing heat from the fluid reservoir wherein the second heat exchanger comprises an evaporator in a refrigerant system through which refrigerant is passed in a closed loop via an expansion valve from a gas cooler and back into a compressor.

17 Claims, 5 Drawing Sheets

(56) References Cited

U.S. PATENT DOCUMENTS

| | | | |
|---|---|---|---|
| 2012/0073316 A1* | 3/2012 | Hegar | F25B 9/008 62/115 |
| 2012/0090808 A1* | 4/2012 | Scofield | H05K 7/2069 165/45 |
| 2012/0234517 A1* | 9/2012 | Ogasawara | F25B 40/00 165/104.21 |
| 2016/0223234 A1 | 8/2016 | Vaisman | |
| 2017/0127563 A1 | 5/2017 | Chainer et al. | |
| 2018/0281562 A1 | 10/2018 | Spies et al. | |
| 2018/0341301 A1* | 11/2018 | Shabbir | G06F 1/206 |
| 2019/0341661 A1* | 11/2019 | Guerra | B60L 58/26 |
| 2020/0113085 A1 | 4/2020 | Schon et al. | |
| 2020/0224937 A1 | 7/2020 | Barbierato | |
| 2020/0236821 A1 | 7/2020 | Meadows et al. | |
| 2020/0348056 A1* | 11/2020 | Street | F25B 1/10 |
| 2021/0070054 A1* | 3/2021 | Idaka | B41J 2/04551 |
| 2021/0148608 A1* | 5/2021 | Gao | H05K 7/20318 |
| 2021/0153392 A1* | 5/2021 | Gao | H05K 7/20818 |
| 2021/0164678 A1 | 6/2021 | Delgoshaei | |
| 2021/0254864 A1* | 8/2021 | Cavalleri | F25B 41/24 |
| 2021/0302088 A1 | 9/2021 | Shao et al. | |
| 2022/0003471 A1 | 1/2022 | Welch | |
| 2022/0295667 A1 | 9/2022 | Bando | |

* cited by examiner

DATA CENTER LIQUID CONDUCTION AND CARBON DIOXIDE BASED COOLING APPARATUS AND METHOD

FIELD

The present invention relates to heat transfer systems and methods, and more particularly, to liquid cooled conduction cooling apparatuses, liquid-cooled electronics racks and methods of fabrication thereof for removing heat generated by one or more electronic systems. Still more particularly, the present invention relates to cooling apparatuses and cooled electronics racks, cooled by modular, stacked heat exchangers comprising complimentary open and closed loop liquid-flow compartments.

BACKGROUND OF THE INVENTION

A data center is a facility used to house computer systems and associated components. The computer systems, associated components housed in data centers and the environmental control cooling systems therein, consume significant amounts of energy. With the modern data center requiring several megawatts (MW) of power to support and cool the computer systems and associated components therein, resource utilization efficiency has become critical to evaluating data center performance.

To support the power consumption of the computer systems, associated components housed in the data centers and environmental control cooling systems, data centers consume a significant amount of water annually. Data center cooling system efficiency is critical to reduce the number of liters of water used per kilowatt hour (kWh) of energy consumed by the computer systems and associated components housed in the data center.

Prior art methods and systems have attempted to develop multi metric views to provide a broader understanding of data center performance. These multi metric views often take into account a single aspect of data center performance, Power Usage Effectiveness (PUE), a measure of how efficiently a data center uses energy. However, there still remains a need for a more nuanced and multi-dimensional metric that addresses the critical aspects of data center performance. In order to establish a more complete view of data center performance, there exists a requirement to assess key aspects of data center performance such as data center efficiency, data center availability and data center sustainability. There remains an additional need for a multi-dimensional metric that is easily scalable and that can accommodate additional new metrics in the future, as they are defined. Embodiments disclosed address precisely such a need.

With exponential increases in compute power density, data center electronics produce more and more heat. Failure to remove heat effectively results in increased device temperatures, potentially leading to thermal runaway conditions. The need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/$cm^2$) increases, resulting in the need to remove heat expeditiously from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices and systems therefore mandates the development of aggressive thermal management techniques using liquid cooling. Embodiments disclosed address precisely such a need.

Multiple electronic equipment units are often housed in high-density assemblies, such as server racks, in which modular electronic equipment units (e.g., servers) are mounted on an upright frame or rack in a vertically spaced, stacked arrangement. Large numbers of such server racks, for example, may in turn be housed together in a high-density electronic equipment facility or data center.

Electronic equipment generates heat, typically requiring cooling to prevent overheating. The importance of heat management is amplified when electronic equipment is located in concentrated density, for example, server racks and data centers. Cooling of rack-mounted server components can be achieved by direct liquid cooling, which sometimes entails circulating a liquid coolant along sealed conduits that pass through the server casings in heat exchange relationship with server components. A complication of direct liquid cooling is that it necessarily brings liquid coolant into close proximity with liquid-intolerant electronic components, and is thus perceived as exposing the server rack and/or data center to substantial leakage failure risks.

SUMMARY

Embodiments disclosed include a heat exchange apparatus comprising, in an electronic device, a first heat exchanger for exchanging heat with the device. According to an embodiment, the heat exchanger comprises a flow duct for receiving a fluid, and at least a portion of the flow duct is arranged for thermal communication with the device. Preferred embodiments include a pressure reducing unit comprising a pump associated with the flow duct and a tube configured for reducing the pressure of the fluid in the portion of the flow duct arranged in thermal communication with the device and less than the pressure external to the duct. Preferably, the tube configured for reducing the pressure of the fluid is a Venturi tube. An embodiment includes a fluid reservoir, and a second heat exchanger for removing heat from the fluid reservoir. Preferably, the second heat exchanger comprises an evaporator in a $CO_2$ refrigerant system through which $CO_2$ refrigerant is passed in a closed loop via an expansion valve from a gas cooler and back into a $CO_2$ compressor.

Embodiments disclosed include a heat exchange method comprising, in an electronic device, discharging heat from the electronic device via a first heat exchanger in thermal communication with the electronic device, wherein the heat exchanger comprises a flow duct for receiving a fluid from a fluid reservoir, such that the flow duct is arranged for thermal communication with the heat exchanger; and reducing the pressure of the fluid in the portion of the flow duct arranged in thermal communication with the heat exchanger to a pressure less than the pressure external to the duct; and removing heat from the fluid reservoir via a second heat exchanger. According to a preferred embodiment, the second heat exchanger comprises an evaporator in a $CO_2$ refrigerant system through which $CO_2$ refrigerant is passed in a closed loop via an expansion valve from a gas cooler and back into a $CO_2$ compressor.

According to a preferred embodiment, the fluid reservoir and the second heat exchanger comprise or are in thermal communication with thermo-electric materials such that the temperature differential between the fluid reservoir and the evaporator are leveraged to generate a current that is used as a source of auxiliary power for the electronic devices/components.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention.

DETAILED DESCRIPTION

Figure 1:
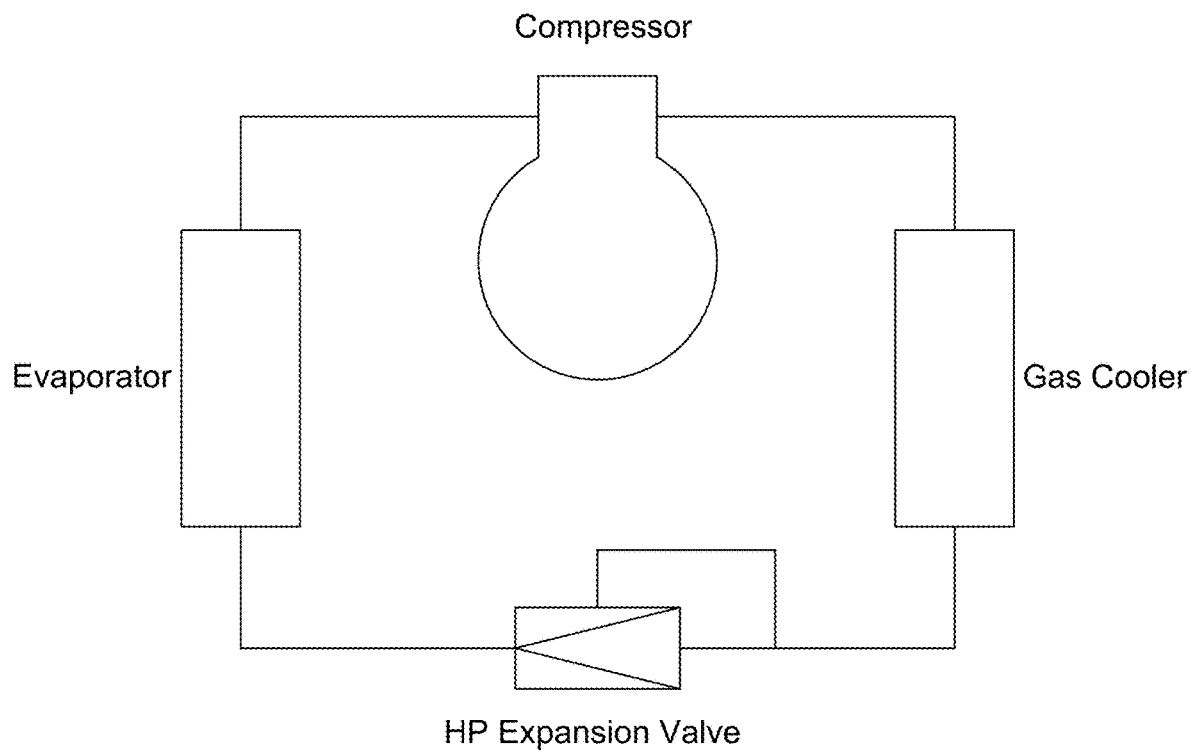
FIG. 1 shows a simple CO2 transcritical system block diagram.

The following is a detailed description of embodiments of the invention depicted in the accompanying drawings. The embodiments are introduced in such detail as to clearly communicate the invention. However, the embodiment(s) presented herein are merely illustrative, and are not intended to limit the anticipated variations of such embodiments; on the contrary, the intention is to cover all modifications, equivalents, and alternatives falling within the spirit and scope of the appended claims. The detailed descriptions below are designed to make such embodiments obvious to those of ordinary skill in the art.

As stated above, the traditional way of monitoring data center infrastructure, collecting data from infrastructure systems, and managing the systems to allow maximizing the operational efficiency is now struggling to cope with new challenges brought by the growing complexity of data centers. Traditional cooling systems and methods are hopelessly inadequate in light of current scale and increased compute density. Embodiments disclosed include systems and methods that address these challenges effectively and efficiently.

Embodiments disclosed include a heat exchange apparatus comprising, in an electronic device, a first heat exchanger for exchanging heat with the device. According to an embodiment, the heat exchanger comprises a flow duct for receiving a fluid, at least a portion of the flow duct being arranged for thermal communication with the device. A preferred embodiment includes a pressure reducing unit comprising a pump associated with the flow duct and a tube configured for reducing the pressure of the fluid in the portion of the flow duct arranged in thermal communication with the device and less than the pressure external to the duct. According to a preferred embodiment, the tube configured for reducing the pressure of the fluid is a Venturi tube. Preferably, the embodiment includes a fluid reservoir. An alternate embodiment includes a second heat exchanger for removing heat from the fluid reservoir. In an additional embodiment, the second heat exchanger comprises an evaporator in a CO2 refrigerant system through which CO2 refrigerant is passed in a closed loop via an expansion valve from a gas cooler and back into a CO2 compressor.

In a preferred embodiment of the heat exchange apparatus, the pump is comprised within the flow duct, and the fluid comprises a liquid. Preferably, the heat exchange apparatus comprises a leak detector configured to detect a breach in the flow duct. In an ideal embodiment, the leak detector comprises a sensor for sensing the pressure of the fluid in the flow duct to enable breach detection. Also, the leak detector in the heat exchange may comprise an ultrasonic sensor for sensing the presence of air within the flow duct, again to enhance enablement for leak detection.

According to an embodiment, the heat exchange apparatus further comprises a mechanism to automatically shut down the electronic device upon sensing the pressure outside of a predetermined range and sensing the presence of air within the flow duct.

According to an embodiment of the heat exchange apparatus, the expansion valve in the CO2 refrigeration system is a high pressure expansion valve configured to allow expanded CO2 refrigerant entering the evaporator.

According to another embodiment of the heat exchange apparatus, the CO2 refrigeration system comprises a control valve configured to direct the liquid CO2 refrigerant from a CO2 coolant reservoir into the second heat exchanger.

According to yet another embodiment the evaporator in the CO2 refrigerant system serves the purpose of the second heat exchanger. Thus, the evaporator is operatively thermally coupled to the first heat exchanger in one embodiment.

According to an alternate embodiment of the heat exchange apparatus, the CO2 refrigeration system further comprises an expansion valve configured to expand the liquid CO2 refrigerant from the CO2 coolant reservoir into vapor and through the second heat exchanger.

FIG. 1 shows a simple CO2 transcritical system block diagram. There are two differences from a traditional system. One is the gas cooler that replaces the condenser, and the other is the expansion device.

In subcritical applications, refrigerant is metered by a capillary tube or thermostatic expansion valve (TEV), the control strategy being to inject liquid into the evaporator and maintain a given superheat entering the compressor. The metering device is selected or designed to ensure that there is complete evaporation ahead of the compressor.

Superheat is maintained to ensure that evaporator efficiency is optimal, and that liquid refrigerant does not enter the compressor. Excessive superheat may lead to overheating of the compressor.

In systems where a thermostatic expansion valve is used rather than a capillary tube, superheat is maintained by placement of a sensing bulb at the outlet of the evaporator. The modulation of the valve is then controlled by the temperature transmitted to it from the bulb and the pressure at an internal or external equalization port.

A different control strategy is needed in transcritical cycles.

Transcritical Expansion Device

A system based on the transcritical CO2 cycle uses a high pressure expansion valve (HPEV). Rather than controlling refrigerant metering from the low-pressure side of the system, modulation control comes from the high side of the system. A mechanical HPEV will control refrigerant injection into the evaporator by opening and closing based on the increase or decrease in gas cooler pressure.

In the HPEV, spring force is a closing force that acts on the top of a diaphragm. Increasing spring force throttles the valve, causing a backpressure in the gas cooler; the valve will not open until that back pressure, opposing spring force, increases to the point where it can overcome spring force and open the valve. The valve set point for the inlet pressure can be adjusted manually by compressing a spring in the valve.

Unlike a TEV, an HPEV does not control evaporator superheat. The HPEV injects refrigerant into the evaporator, but superheat is not directly controlled—instead it is indirectly regulated by system design.

The system charge, its distribution between the components, evaporator design, and the heat load, along with other external operating conditions, determines system superheat. By controlling the gas cooler pressure, the HPEV will indirectly influence system superheat, but the system must be designed so that liquid refrigerant in the evaporator outlet is not allowed to return to the compressor.

The HPEV was designed to control gas cooler pressure rather than suction line superheat as does a TEV. An HPEV, therefore, must withstand high-side $CO_2$ pressures that can reach 1500 psia, at the same time accurately controlling gas cooler pressure. Slight changes in gas cooler pressure will have significant influence on the system cooling capacity and energy efficiency (COP).

The function of the compressor in a transcritical application is the same as in a subcritical one. The compressor creates refrigerant flow, increasing discharge pressure and therefore raising refrigerant temperature to a level high enough that heat absorbed in the evaporator will be rejected in the condenser or gas cooler.

Due principally to the higher $CO_2$ working pressures, several challenges need to be overcome, like for example, the shell construction, internal leakage across the piston, piston and bearing loading, and bearing lubrication, all due to the higher pressures.

According to an ideal embodiment, outer shell construction must be of extreme robustness to handle the higher pressures. Preferably, piston rings are added to prevent internal cylinder leakage. The piston connecting rod bearing design is modified due to a smaller piston diameter and higher specific forces on the bearing. Of course, alternate embodiments may use conventional cooling systems using traditional lower pressure refrigerants like Freon, but $CO_2$ has a zero carbon footprint and no greenhouse gas (GHG) emissions whatsoever.

The volumetric refrigeration capacity of $CO_2$ is much higher than that of traditional refrigerants, allowing system designs with smaller volumes. This also holds true for other components. Smaller cylinder displacement still provides adequate system capacity.

Compression ratio is a major factor contributing to $CO_2$ compressor performance. Current HFC compressors for MBP-operation with R-134a refrigerant, for example, are designed for compression ratios of approximately 8 to 1, and become inefficient at higher ratios.

$CO_2$ systems operate at higher pressures, but the compression ratio is only 3 or 4 to 1. The lower compression ratio will give the compressor the capability to operate with less of a refrigerant re-expansion effect in the cylinder during operation.

Now that there are functional designs for compressors, heat exchangers, and high pressure expansion devices, the transcritical cycle with $CO_2$ becomes a viable alternative for users seeking a solution that is acceptable worldwide. It is a natural refrigerant that will allow users to be identified as environmentally proactive. These facts will continue to fuel development of $CO_2$ components and system designs.

When $CO_2$ is pressurized and depressurized, heating and cooling functions occur. However, it is necessary to apply seven to 10 times more pressure than is required when using Freon gas. Accordingly, the components used in the system must be able to withstand these higher pressures. According to a preferred embodiment, the plumbing/piping material can withstand the high pressure of up to 70-150 bar. Thus, high grade stainless steel, or/and titanium and titanium alloys are preferred materials of choice. However, $CO_2$ does present superior thermodynamic properties, beginning with high volumetric cooling capacity. This essentially means that a smaller volume of $CO_2$ is required for high capacity cooling. Further, $CO_2$ is up to 5 times greener than R404A and other refrigerants. Additionally, it is possible to use smaller pipes and compressors, making for scalable modular units that can be configured and reconfigured especially in the context of, but not limited to, data center cooling. $CO_2$ is a high pressure refrigerant with a pressure of 71 bar at 30 degrees centigrade. Being a high density gas, $CO_2$ enables an increased heat exchanger efficiency, and enables greater cooling capacities with smaller surfaces, thereby increasing the ease of creating modular units coupled to modular, scalable data center racks and rack mounted electronic systems.

Other significant factors are reliability, weight, cost and so forth. Transcritical systems provide an efficient, simple and cost effective solution in all climates.

Figure 2:
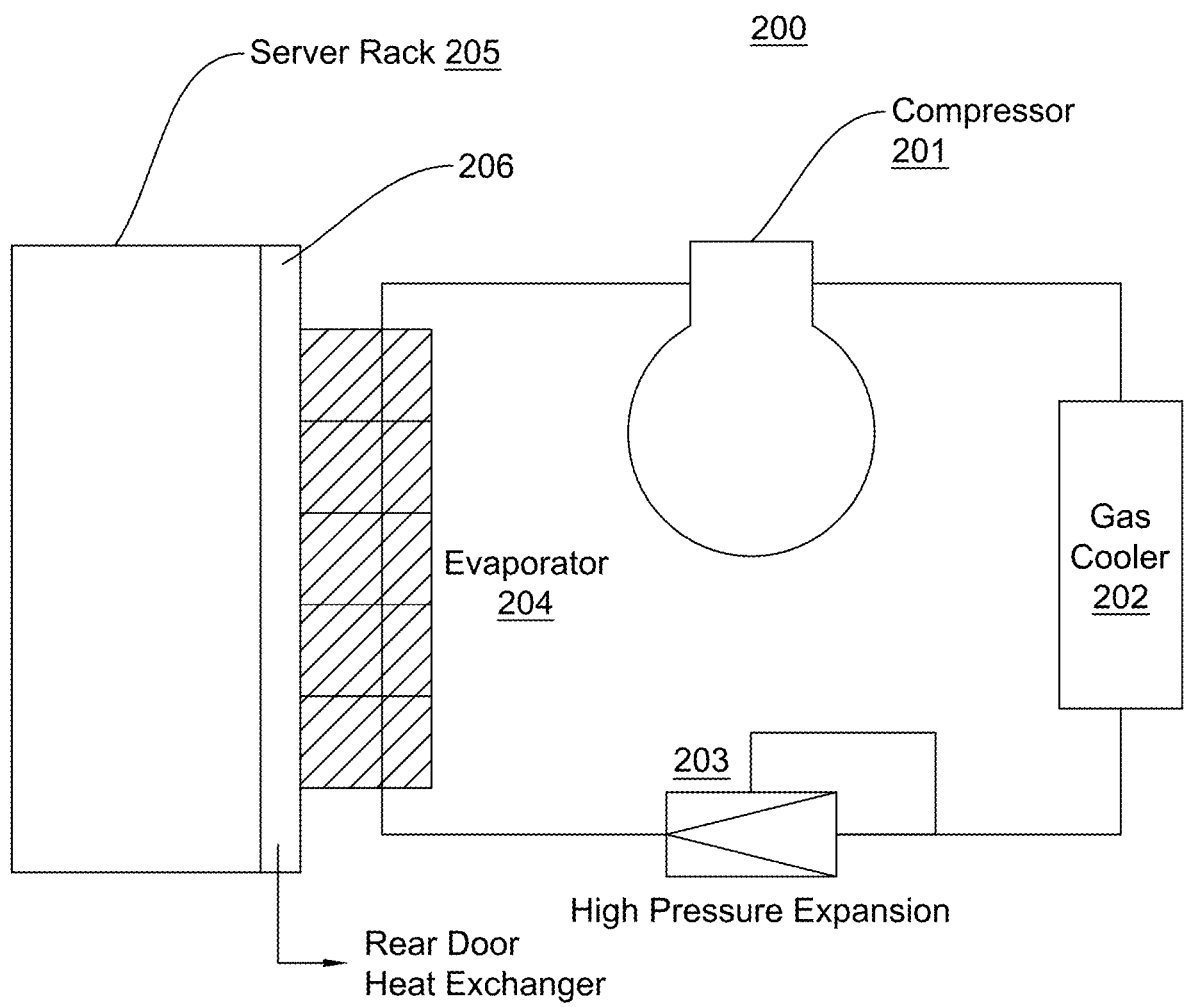
FIG. 2 illustrates a rear door heat exchanger in a server rack, coupled to an evaporator in a carbon dioxide refrigerant based cooling system.

FIG. 2 illustrates a rear door heat exchanger in a server rack, coupled to an evaporator in a carbon dioxide refrigerant based cooling system according to an embodiment. The system 200 comprises a compressor 201 operatively coupled to a gas cooler 202, a high pressure expansion valve 203 and an evaporator 204. The evaporator 204 is in thermal communication with server rack 205 through rear door heat exchanger 206 comprised in server rack 205. Rear door heat exchanger 206 is further in thermal communication with electronic devices/components (not shown) comprised in server rack 205. According to an embodiment, the rear door heat exchanger 205 comprises a flow duct for receiving a fluid, at least a portion of the flow duct being arranged for thermal communication with the electronic device. A preferred embodiment includes a pressure reducing unit comprising a pump associated with the flow duct and a tube configured for reducing the pressure of the fluid in the portion of the flow duct arranged in thermal communication with the device and less than the pressure external to the duct. According to a preferred embodiment, the tube configured for reducing the pressure of the fluid in the portion of the flow duct arranged in thermal communication with the device is a Venturi tube. Preferably, the embodiment includes a fluid reservoir. According to an alternate embodiment, the flow duct of the rear door heat exchanger is replaced or supplemented by rear door cooling fans wherein hot air exhaled from the fans is cooled by the evaporator 304 in thermal communication with server rack 205 and the cooled air is recirculated through the electronic devices/components comprised in server rack 205. According to yet another alternate embodiment, the evaporator 204 is in thermal communication with a heat exchange plate, wherein a plurality of heat pipes from a corresponding plurality of server racks are in thermal communication with the heat exchange plate. According to a novel embodiment, the heat exchange plate and the evaporator 204 incorporate high-efficiency thermo-electric devices comprising quantum well materials. According to one embodiment, high-efficiency thermo-electric devices comprising Ayto metals are used. The temperature difference between the heat exchange plate and the evaporator is leveraged in the Peltier-Seebeck effect to generate a current and serve as an auxiliary power source to the electronic systems and devices. According to one embodiment, the auxiliary is directed exclusively towards the cooling system.

Figure 3A:
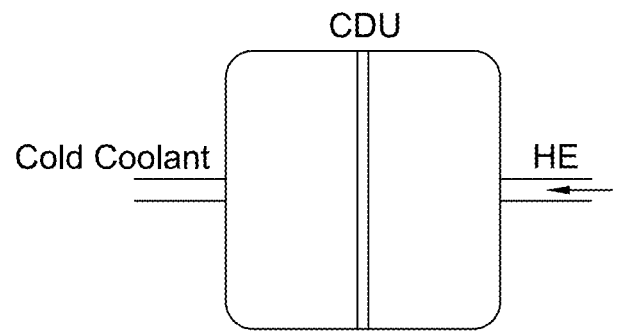
FIG. 3A depicts a coolant distribution unit in an embodiment.
Figure 3B:
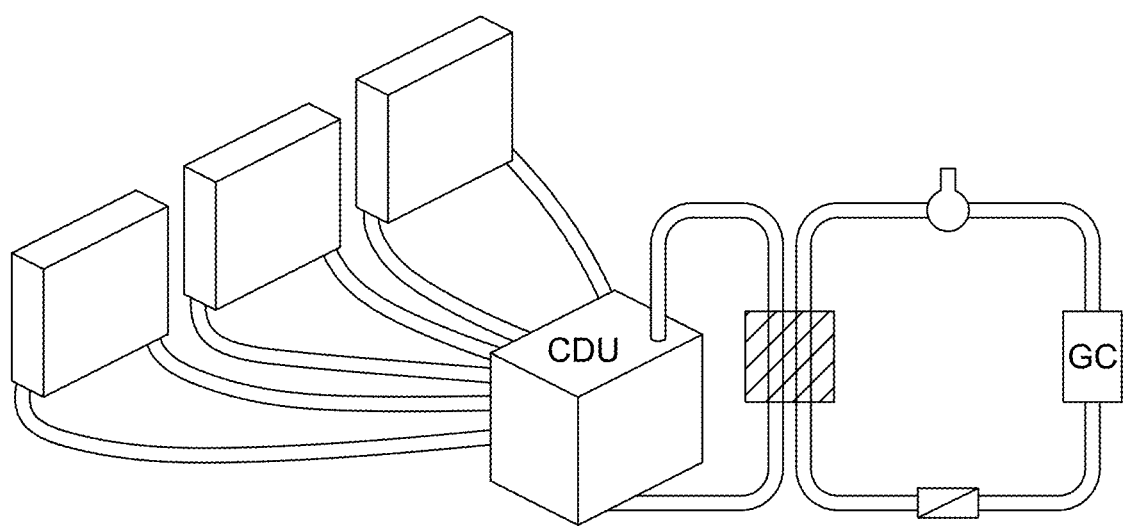
FIG. 3B illustrates a configuration of the coolant distribution unit in thermal communication with the rear door heat exchangers and a closed loop refrigerant based cooling unit.
Figure 4:
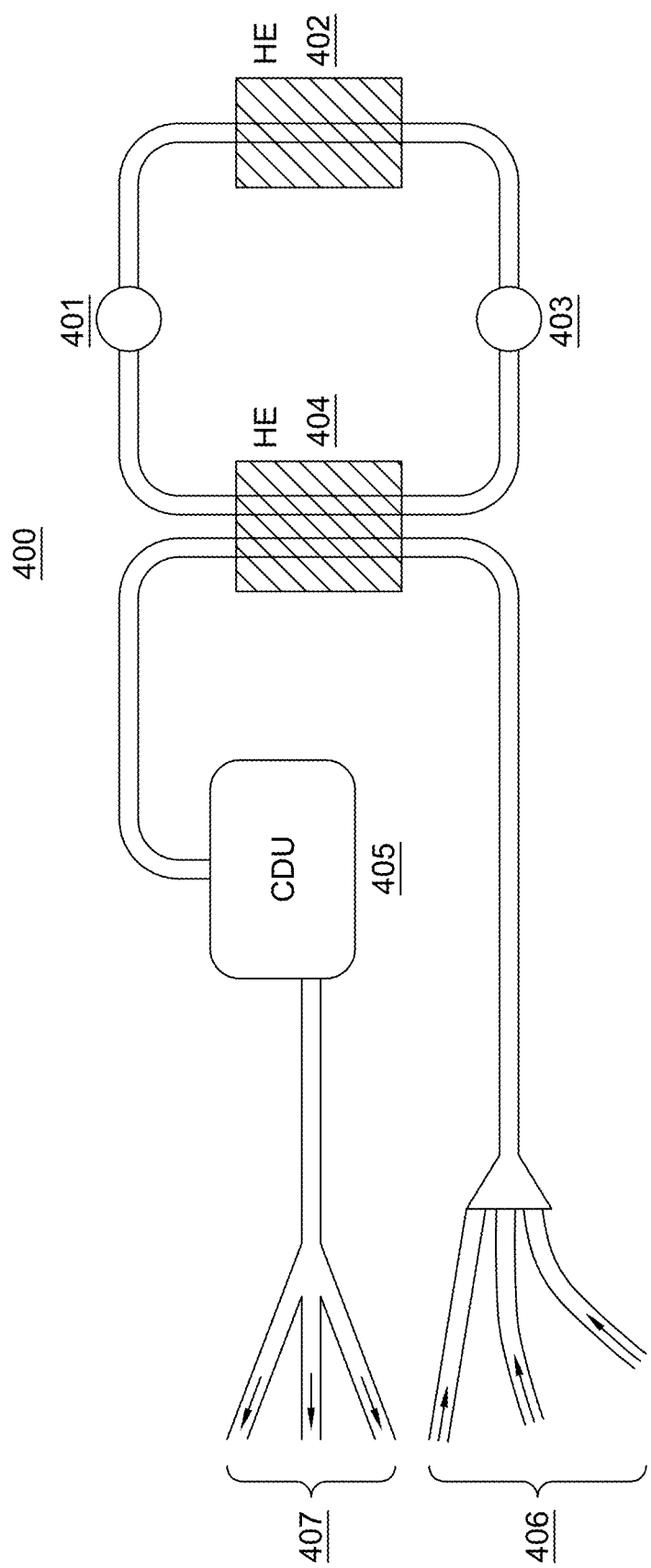
FIG. 4 illustrates an alternate configuration according to an embodiment.

FIGS. 3A and 3B illustrate an alternated configuration according to an embodiment. FIG. 3A depicts a coolant distribution unit in an embodiment. FIG. 3B illustrates a configuration of the coolant distribution unit in thermal communication with the rear door heat exchangers and a closed loop refrigerant based cooling unit. FIG. 4 illustrates an alternate configuration according to an embodiment. The system 400 comprises compressor 401, a first heat exchanger 402, a high pressure expansion valve 403, and a second heat exchanger 404. The system further comprises coolant distribution unit 405, hot coolant inflow pipes 406 through which hot coolant flows through heat exchanger 404 discharging heat, and the cooled coolant flows into coolant distribution unit 405 from where it is caused to flow via coolant piping 407 into a plurality of rear door heat exchangers 305 comprised in a corresponding plurality of server racks 306.

According to an alternate embodiment, the hot coolant flows through heat exchanger 404 wherein heat exchanger 404 comprises a hot side heat sink thermally coupled to a cold side heat sink physically separated from the hot side heat sink and comprising a heat conduit coupling the hot side heat sink to the cold side heat sink. The temperature difference between the hot side heat sink and the cold side heat sink is leveraged in the Peltier-Seebeck effect to generate a current and serve as an auxiliary power source to the electronic systems and devices. Preferred embodiments incorporate high-efficiency thermo-electric devices comprising quantum well materials. According to one embodiment, high-efficiency thermo-electric devices comprising Ayto metals are used.

CO2 Natural Refrigerant

Embodiments disclosed enable the utilization of $CO_2$ reclaimed from the environment. Embodiments disclosed enable capture of $CO_2$ for commercial use through piped distribution, and especially for industrial refrigeration. Embodiments disclose enable the use of $CO_2$ as a refrigerant several thousand times better for the environment than traditional gases that are currently in use.

$CO_2$ is one of several natural gases that can be used as a refrigerant. However there are several disadvantages. Embodiments disclosed overcome disadvantages and enable practical usage of $CO_2$ in both the short and long term. There are several reasons as to why it is the best option, however the most applicable reason for our use is demonstrated below.

Figure 5:
FIG. 5 depicts, from left to right the GWP (global warming potential) of various refrigerants against carbon dioxide.

Running from left to right the GWP (global warming potential) is depicted in FIG. 5. In global warming potential, each number is relative to equivalent of $CO_2$ emitted, for example each Kg of R410 in the atmosphere is the same as 2088 Kg of $CO_2$ number lowers, however as a result of the change in the composition of gas, the refrigerants then become flammable and belong to a new classification of gas 'A2L'. $CO_2$ presents challenges but also has an incredibly low GWP figure while not being flammable. This makes it perfect for worry free Data Center use.

Embodiments disclosed include industrial and data center chiller systems initially, in comparable duty sizes to competition whilst improving efficiency as a result and being a similar cost, partially due to the nature of $CO_2$, further eliminating the need for phase change, saving energy and replacing traditional absorption and other industrial chillers.

Embodiments disclosed include modular chiller systems up to a duty of 800 kW and beyond, but modularity enables chiller systems to be placed together with sizes of 100 kW, 300 kW, 500 kW and 800 kW. Embodiments of the chillers are capable of sustaining the 20° C.-30° C. LWT and EWT through the PHE that makes the product impossible to match for the competition in dry land scenarios.

In short, the ability to use $CO_2$ is a very different proposition by comparison to what it was even 2-3 years ago. This means that it is commercially an option where previously it would not have been prior.

For example the $CO_2$ chiller is perfect for use as a 'trim' chiller on the barge or as the most environmentally conscious on land for a number of reasons, the most important reasons are the following:

1. The environmental impact from $CO_2$ is actually removing carbon from the atmosphere in order to run the system.

2. The chillers, compared to any other commercially available chiller in the marketplace today, would be running on gas that is truly the most environmentally friendly solution, sometimes by up to several thousand times better.

3. The modular design of the chiller would allow for the smallest possible footprint used to maximise sellable space inside the data halls on sea or minimize space usage and enable more 'Edge' prefabricated solutions on land.

The chillers green credentials and space saving make it the perfect product to work with giving users an advantage over the rest of the market using conventional gases.

Preferably, there are no "removable components" each electronic device in a rack will have its own apparatus. According to one embodiment, each electronic system on the rack has its own heat exchange apparatus. According to another embodiment of the apparatus, there is no requirement for any air flow.

Embodiments disclosed demonstrate a concerted effort to capture rather than dissipate heat and convert the captured heat to electricity thus creating an auxiliary power source, hitherto un attempted.

Embodiments disclosed demonstrate the placement of thermoelectric material near the heat source, and at the very least, placement of thermo-electric material at a heat exchange point in order to leverage the temperature differential between the concentrated heat and the cooling heat exchanger.

Embodiments disclosed provides for repeated hierarchical steps of heat transfer from thermal sources, conducted through a heat exchange or other thermal interface, and transferred to a thermal sink.

Embodiments disclosed enable modular, scalable and re-configurable introduction of energy harvesting operations wherein energy harvesting operations convert heat into electricity.

Embodiments, disclosed enable electricity created by energy harvesting operations to provide power for current or future heat transfer operations.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of systems and methods that facilitate cooling of electronic systems, and more specifically automated cooling infrastructure especially pertaining to data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to liquid-cooled conduction cooling structures and air cooled structures in data centers, the system and method is highly reconfigurable, and may be used in other industrial, commercial, and residential refrigeration, cooling, heating and HVAC systems. Portions of the embodiment may be used to support other types of heating, cooling, ventilation, and refrigeration systems in industrial, commercial, residential, transportation, and other systems. Modifications of the embodiments may be used in heat transfer systems, and to capture emitted heat from heat sources and convert the captured heat to electricity to serve as an auxiliary power source. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A heat exchange apparatus, comprising:
   in an electronic device, a first heat exchanger for exchanging heat with the device, the heat exchanger comprising a flow duct for receiving a fluid, at least a portion of the flow duct being arranged for thermal communication with the device; and
   a pressure reducing unit for reducing a pressure of the fluid in a portion of the flow duct arranged in thermal communication with the device and less than a pressure external to the duct;
   a fluid reservoir,
   a second heat exchanger for removing heat from the fluid reservoir;
   wherein the second heat exchanger comprises an evaporator in a CO2 refrigerant system through which CO2 refrigerant is passed in a closed loop via an expansion valve from a gas cooler and back into a CO2 compressor.

2. The heat exchange apparatus of claim 1, wherein the fluid comprises a liquid.

3. The heat exchange apparatus of claim 1, further comprising a leak detector configured to detect a breach in the flow duct.

4. The heat exchange apparatus of claim 3, wherein the leak detector comprises a sensor for sensing the pressure of the fluid in the flow duct.

5. The heat exchange apparatus of claim 3 wherein the leak detector comprises an ultrasonic sensor for sensing the presence of air within the flow duct.

6. The heat exchange apparatus of claim 4, further comprising a mechanism to automatically shut down the electronic device upon sensing the pressure outside of a predetermined range and sensing the presence of air within the flow duct.

7. The CO2 refrigeration system of claim 1, wherein the expansion valve is a high pressure expansion valve configured to expand the CO2 refrigerant entering the evaporator.

8. The CO2 refrigeration system of claim 2, further comprising a control valve configured to direct the liquid CO2 refrigerant from a CO2 coolant reservoir into the second heat exchanger.

9. The CO2 refrigeration system of claim 3, wherein the expansion valve is configured to expand the liquid CO2 refrigerant from a CO2 coolant reservoir into vapor and through the second heat exchanger.

10. A heat exchange method comprising:

in an electronic device, discharging heat from the electronic device via a first heat exchanger in thermal communication with the electronic device, wherein the heat exchanger comprises a flow duct for receiving a fluid from a fluid reservoir, such that the flow duct is arranged for thermal communication with the heat exchanger; and reducing a pressure of the fluid via a pump associated with the flow duct, in a portion of the flow duct arranged in thermal communication with the heat exchanger to a pressure less than a pressure external to the duct; and removing heat from the fluid reservoir via a second heat exchanger wherein the second heat exchanger comprises an evaporator in a CO2 refrigerant system through which CO2 refrigerant is passed in a closed loop via an expansion valve from a gas cooler and back into a CO2 compressor.

11. The heat exchange method of claim 10, wherein the fluid comprises a liquid.

12. The heat exchange method of claim 10, further comprising detecting a breach in the flow duct via a leak detector.

13. The heat exchange method of claim 12, wherein detecting the breach in the flow duct via the leak detector further comprises sensing the pressure of the fluid in the flow duct via a pressure sensor.

14. The heat exchange method of claim 12, wherein detecting the breach in the flow duct via the leak detector further comprises sensing the presence of air within the flow duct via an ultrasonic sensor.

15. The heat exchange method of claim 14, further comprising automatically shutting down the electronic device upon sensing the pressure outside of a predetermined range and sensing the presence of air within the flow duct.

16. The heat exchange method of claim 10, wherein the expansion valve is a high pressure expansion valve configured to expand CO2 refrigerant entering the evaporator.

17. The heat exchange method of claim 10, further comprising a control valve configured to direct liquid CO2 refrigerant from the gas cooler into the evaporator.

* * * * *